United States Patent [19]
Fisher et al.

[11] Patent Number: 5,105,164
[45] Date of Patent: Apr. 14, 1992

[54] HIGH EFFICIENCY UHF LINEAR POWER AMPLIFIER

[75] Inventors: Reed E. Fisher, Morris Plains; Michael J. Koch, Towaco, both of N.J.

[73] Assignee: AT&T Bell Laboratories, Murray Hill, N.J.

[21] Appl. No.: 316,891

[22] Filed: Feb. 28, 1989

[51] Int. Cl.⁵ .................... H03F 1/26; H03C 1/06
[52] U.S. Cl. .................... 330/149; 332/162; 455/126
[58] Field of Search ............ 330/2, 10, 149, 251, 330/207 A, 290, 291; 332/37 D, 18, 123, 162; 455/126

[56] References Cited

U.S. PATENT DOCUMENTS

| | | | |
|---|---|---|---|
| 3,486,128 | 12/1969 | Lohrmann | 332/37 D X |
| 3,900,823 | 8/1975 | Sokal et al. | 330/149 |
| 4,276,514 | 6/1981 | Huang | 330/149 |
| 4,574,248 | 3/1986 | Snodgrass | 330/2 |
| 4,706,262 | 11/1987 | Ohta | 455/126 X |
| 4,776,036 | 10/1988 | Hulsey et al. | 455/108 |

Primary Examiner—Steven Mottola
Attorney, Agent, or Firm—Jack S. Cubert

[57] ABSTRACT

An RF amplifier for a phase and envelope varying signal employs a class C operated device for high efficiency. In order to improve the linearity of the class C operated device, a signal corresponding to the envelope of the amplifier output is formed and a portion thereof is fed back to an envelope modulation element such as a pulse width modulator connected to the class C operated device to reduce distortion at the amplifier output.

6 Claims, 5 Drawing Sheets

HIGH EFFICIENCY UHF LINEAR POWER AMPLIFIER

FIELD OF THE INVENTION

The invention relates to RF power amplification and, more particularly, to RF power amplifier arrangements in which an amplifier output signal is fed back to reduce distortion.

BACKGROUND OF THE INVENTION

RF power amplifiers used in communication systems are generally required to have a specified degree of linearity. Circuits employing class A or class AB operated devices are controlled to be in the linear range of their characteristics and provide such linear amplification. Greater linearity can be obtained by adding RF feedback or feed forward circuitry. It is well known, however, that linearly operated devices exhibit relatively low average dc-rf efficiency. Consequently, there is an increase in power consumption and heat dissipation. To obtain higher average dc-rf efficiency, amplifiers using class C operated devices have been utilized. Class C operation uses the non-linear characteristics of the device whereby the dc-rf efficiency is greatly improved but linearity is impaired. Where envelope modulation is used, the average dc-rf efficiency of a class C amplifier can be further improved by incorporating a pulse width modulator in the class C amplifier as disclosed, for example, in U.S. Pat. No. 4,776,036 issued Oct. 4, 1988 to G. L. Hulsey et al.

While class C operation significantly improves efficiency through use of non-linear characteristics, the non-linear operation causes signal distortion and some form of distortion reduction circuitry must be added to meet linearity specifications. U.S. Pat. No. 4,276,514 issued June 30, 1981 to M. Y. Huang discloses a wideband, phase compensated amplifier with negative feedback to reduce distortion in the output signal in which a low cost, power efficient class C amplifier is positioned along a primary signal path and a feedback loop is coupled to provide negative feedback of distortion signal components in the amplified output signal. The negative feedback loop is coupled to provide the distortion signal components as negative feedback to the primary signal path by adding the distortion signal components to the input signal ahead of a first amplifier stage. The distortion reduction arrangement, however, requires a complex feedback path operating at RF frequencies with critical time delay provisions for phase adjustment.

U.S. Pat. No. 3,900,823 issued to Sokal et al Aug. 19, 1975 discloses a power amplifying and signal processing system for modulated carrier signals which separately processes the amplitude component of the system input signal and the component of frequency or phase or both frequency and phase, and later recombines the separately processed components to provide an output signal. The input signal is fed to a power amplifier whose output provides the output for the system. The input and output signals of the system are fed by separate paths to a comparator which compares those signals and emits an error signal to a controller. The controller regulates the amplitude and phase, or both, of the power amplifier's output to null the error signal. One or both of the signal paths to the comparator may have in it a non-linear function generator which acts upon the signal fed by that path to the comparator. While the system regulates the amplifier operation responsive to the modulation components, it is relatively ineffective to remove distortion at the input signal rate.

U.S. Pat. No. 4,574,248 issued Mar. 4, 1986 to K. A. Snodgrass discloses a transceiver in which the radio frequency signal output is coupled as the input to a power amplifier through a directional coupler to provide a sample of the RF input. The sampled input is coupled through a radio frequency detector to detect the envelope of the RF input and thence through a limiter to the input of a difference amplifier. The output from the power amplifier is coupled through a low pass filter to provide the amplified radio frequency output through a second directional coupler to provide a sample of that radio frequency output. The sampled output is also coupled through an RF detector to detect the envelope of the RF output and provide that of the second input to a difference amplifier. The output of the difference amplifier is then used to control the bias of the RF power amplifier for power output control. The signals representing the detected envelope of the RF input and the RF output are also compared in a difference amplifier to produce an output which is compared with a fault threshold to provide a fault signal representing a failure in the output of the control loop or power amplifier. The bias control provided by this arrangement, however, does not effect distortion correction at the signal rate.

In some communication systems, a signal input to an RF power amplifier using phase or frequency modulation also exhibits envelope variations that must be preserved in the amplifier output so that the use of a class C amplifier device with a pulse width modulator to maximize efficiency results in distortion of the output signal envelope. In cellular telephone systems, for example, the outputs of a plurality of FM or phase modulated channels are sometimes combined so that the combined outputs can be applied to a common power amplifier. The envelope of the combined channel signal exhibits significant amplitude variations which variations must be preserved in the amplifier output. In systems using phase shift keying or differential phase shift keying, it is advantageous to reduce the amplitude of the phase modulation signal during shifts between predefined phases to minimize the output signal bandwidth. As a result, the envelope of the modulated signal includes an amplitude modulation component which must be amplified without distortion. It is an object of the invention to provide an improved RF amplifier for envelope and phase varying information signals having both high efficiency and high linearity.

SUMMARY OF THE INVENTION

The foregoing object is achieved in an RF amplifier employing a class C operated device by forming a signal corresponding to the envelope of the amplifier output and feeding back a portion of the envelope corresponding signal to an envelope modulation element such as a pulse width modulator connected to the class C operated device to reduce distortion due to class C non-linearity.

The invention is directed to a circuit for amplifying an envelope varying radio frequency signal. The circuit comprises an amplifying device having first, second and control electrodes, a supply voltage source and a loading device coupled to the first electrode. The envelope variations are separated from the radio frequency signal to form an envelope variation signal and a constant magnitude signal and the constant magnitude radio frequency signal is applied to the control electrode of the amplifying device. A modulator responsive to signals received at its input terminal is coupled between the voltage source and the first electrode to modulate the radio frequency signal on the first electrode of the amplifying device. A signal corresponding to the envelope variations of the radio frequency signal coupled to the loading device is formed. The difference between the envelope variations signal and the envelope variations signal coupled to the loading device is applied to the input terminal of the modulator whereby the distortion in the envelope modulated wave at the loading device is reduced.

According to one aspect of the invention, the radio frequency signal has angle type variations and envelope variations. The signal corresponding to the angle varying radio frequency signal is applied to the control electrode of the amplifying device. A pulse width modulator responsive to signals received at its input terminal is coupled between the voltage source and the first electrode to modulate the radio frequency signal on the first electrode of the amplifying device. A first signal corresponding to the envelope variations of the radio frequency signal and a second signal corresponding to the envelope variations of the radio frequency signal coupled to the loading device are formed. The difference between the first and second signals is applied to the input terminal of the pulse width modulator whereby the distortion in the envelope modulated wave at the loading device is reduced.

DETAILED DESCRIPTION

Figure 1:
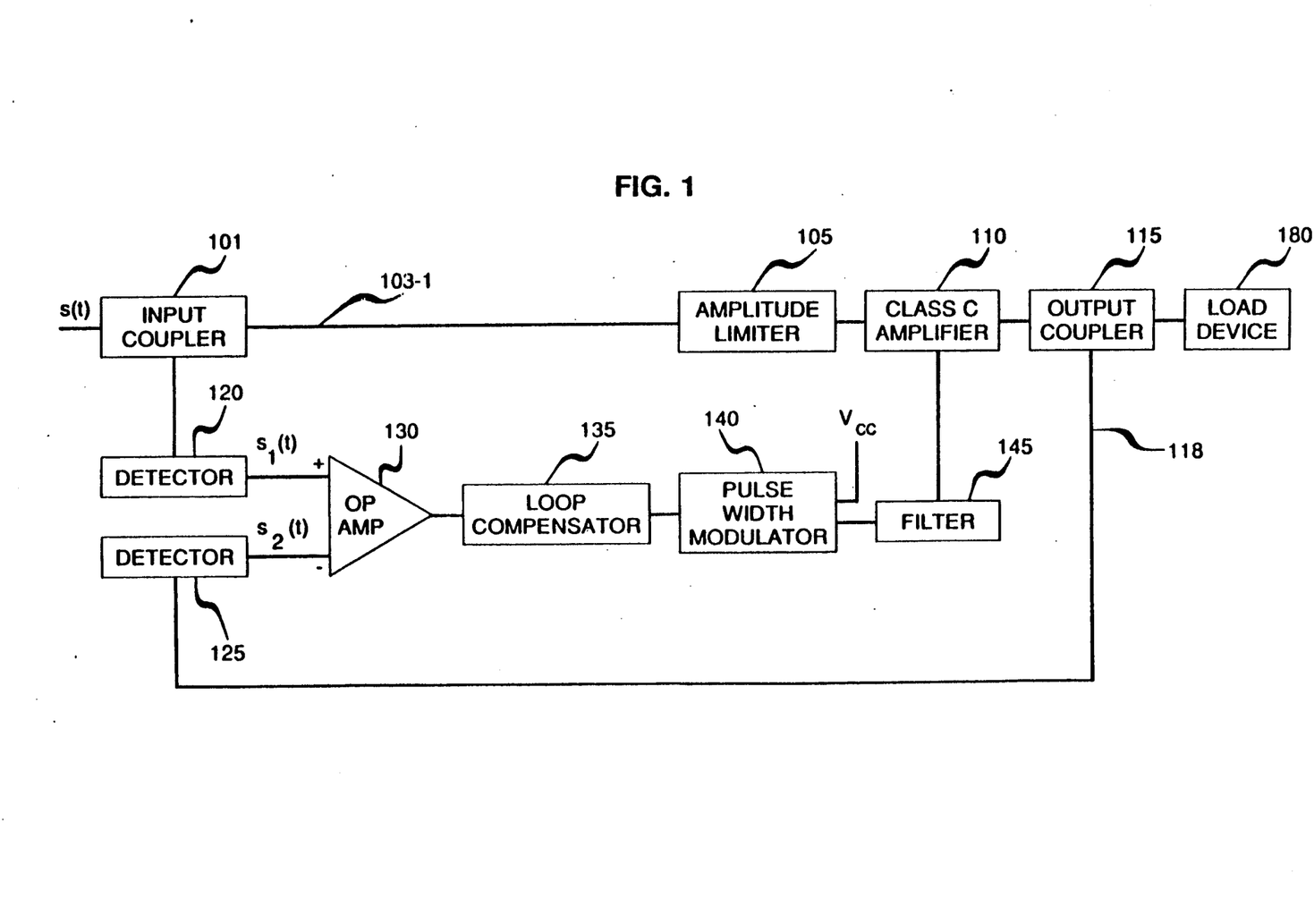
FIG. 1 depicts a general block diagram of an RF amplifier circuit for an envelope varying FM signal that is illustrative of the invention.
Figure 2:
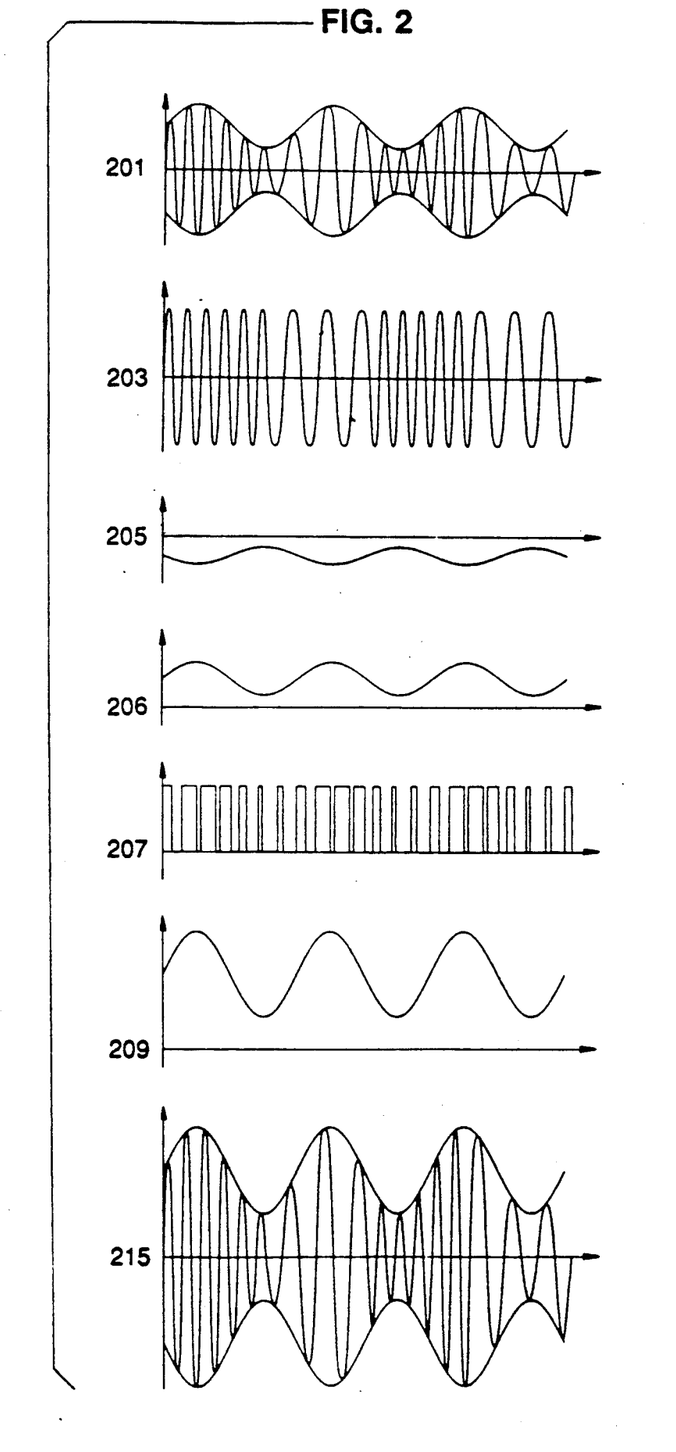
FIG. 2 shows waveforms illustrating the operation of the circuit of FIG. 1.

FIG. 1 is a block diagram of an RF power amplifier illustrative of the invention that may be incorporated in a cellular telephone cell site to amplify the combined outputs of a plurality of channels. Each channel provides a frequency or phase modulated signal. As is well known in the art, the envelope of the combined output of the channels has a time varying envelope even if the envelopes of the individual channel signals are constant. FIG. 2 shows waveforms illustrating the operation of the circuit of FIG. 1. Waveform 201 illustrates the combined channel signal. The amplifier produces a higher power version of the combined channel signal which is coupled to a load device such as an antenna. The amplifier employs a class C operated semiconductor device for high efficiency. In accordance with the invention, the circuit of FIG. 1 also attains a high degree of linearity to avoid introducing distortion of either the frequency modulation or the envelope variations.

Referring to FIG. 1, a combined channel signal s(t) illustrated in waveform 201 of FIG. 2 is applied to input coupler 101. The coupler supplies a portion of signal s(t) to the input terminal of class C amplifier 110 through amplitude limiter 105. Another portion of signal s(t) is supplied to envelope detector 120 which forms the signal $s_1(t)$ corresponding to the envelope of signal s(t). Signal $s_1(t)$ is shown in waveform 205. Amplitude limiter 105 removes the envelope variations from the signal on lead 103-1 but does not affect the frequency or phase variations thereof as shown in waveform 203. Envelope variation signal $s_1(t)$ is supplied to the positive input of operation amplifier 130 and its output passes through loop compensator 135 to the input terminal of pulse width modulator 140. The loop compensator is adapted to stabilize the operation of the path through operational amplifier 130 and pulse width modulator 140.

Pulse width modulator 140 is interposed between voltage source $V_{cc}$ and the output electrode of amplifier 110 to provide envelope modulation in accordance with the envelope variations of signal s(t). The modulator has one output terminal coupled to a voltage source $V_{cc}$ and another output terminal coupled to an amplitude modulating electrode of class C amplifier 110 via filter 145. As is well known, the pulse width modulator is adapted to convert the envelope variations applied to its input terminal into pulses having widths proportional to the magnitude of the envelope variations to improve efficiency. Filter 145 removes the high frequency components of the pulse width modulator output so that class C type modulation is obtained. It is to be understood, however, that other envelope modulation schemes known in the art may also be used. The output of amplifier 110 shown in waveform 215 includes components corresponding to both the angle variations attributable to frequency or phase modulation and the envelope variations of signal s(t). The envelope variations applied to load device 180 via output coupler 115, however, are distorted due to saturation of the class C operated semiconductor device in amplifier 110.

In accordance with the invention, a portion of the output signal applied to coupler 115 is fed back through lead 118 and envelope detector 125 to the negative input of operational amplifier 130. Detector 125 is operative to form a signal $s_2(t)$ corresponding to the distorted envelope variations in the output of amplifier 110. Signal $s_2(t)$ is substantially similar to signal $s_1(t)$. The difference between signals $s_1(t)$ and $s_2(t)$ is amplified in operational amplifier 130 and its output signal (waveform 206) is applied to the input of pulse width modulator 140. The pulse width modulator output (waveform 207) is filtered in filter 145 so that an envelope modulating signal (waveform 209) is applied to amplifier 110. The feedback arrangement in FIG. 1 is operative to reduce the distortion in the envelope variation whereby both high efficiency and linear amplification are obtained in a class C amplifier.

Figure 3:
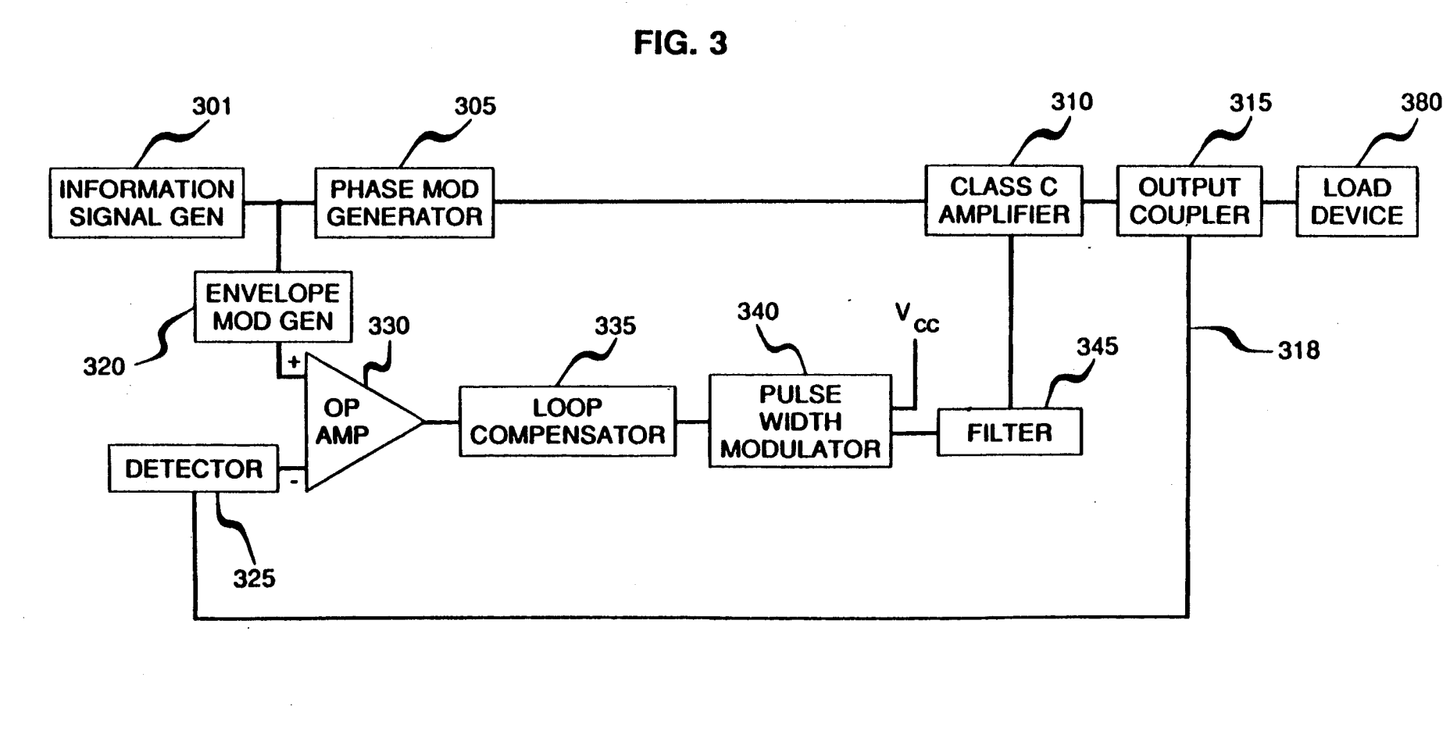
FIG. 3 depicts a general block diagram of another RF amplifier circuit for an amplitude varying differential phase shift keyed signal that is illustrative of the invention.

FIG. 3 is a block diagram of another RF power amplifier illustrative of the invention adapted to receive a signal s(t) representing audio, data or other information in digital form. The information signal is converted into a quaternary differential phase shift keyed (QDPSK) signal wherein the successive dibits are represented by corresponding four quadrant phase shift modulation of an RF carrier. The modulated carrier after amplification is applied to a communication channel such as a radio channel in cellular telephone. Each successive dibit in the information pattern is represented by a phase symbol. As is well known in the art, the envelope of the modulated RF carrier may be constant. It is advantageous, however, to reduce the envelope between phase shifts to minimize the bandwidth of the RF signal applied to the communication channel. Thus both QDPSK and envelope modulation must be applied simultaneously to the RF carrier and amplified to the level required by the communication channel.

While a class A or Class AB amplifier has sufficient linearity to accommodate the dual modulation, the low average dc-rf efficiency requires a power consumption level that is high for portable cellular units using a small battery power source. The class C amplifier of FIG. 3 provides the needed efficiency and the envelope modulation feedback provides the required linearity. Referring to FIG. 3, information signal generator 301 produces a dibit pattern corresponding to an information source (not shown). The dibit pattern is supplied to phase modulation generator 305 which generates a QDPSK modulated carrier having a constant envelope shown in waveform 401 of FIG. 4 and to envelope modulation generator 320 which produces a varying envelope adapted to minimize bandwidth as aforementioned.

Figure 4:
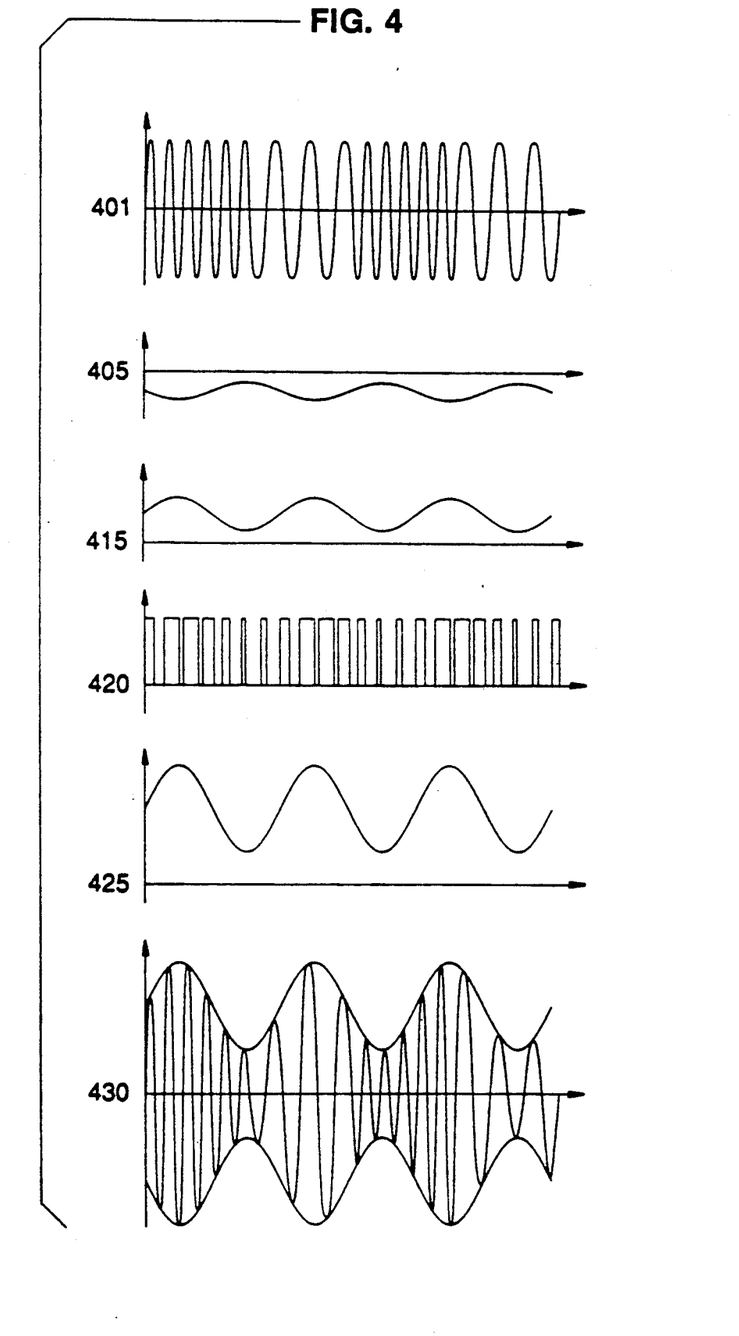
FIG. 4 shows waveforms illustrating the operation of the circuit of FIG. 3.

Class C amplifier 310 receives the phase varying carrier signal at its input terminal. The envelope signal from generator 320 (waveform 405) is supplied to the positive input of operational amplifier 330. The operational amplifier output is then applied to the input of pulse width modulator 340 through loop compensator 335, the output of which is shown in waveform 415. Pulse width modulator 335 has one output terminal connected to voltage source $V_{cc}$ and another output terminal coupled to amplifier 310 via filter 345. In accordance with the well known principles of class C operation, the output of amplifier 310 (waveform 430) is a higher power level RF carrier that includes both a QDPSK modulation component and an envelope modulation component. The class C operated semiconductor device of amplifier 310 is subject to saturation during at least a part of its operating cycle so that distortion of the envelope modulation is expected.

Output coupler 315 receives the output of amplifier 310 and supplies load device 380. A portion of this output is coupled to envelope detector 325 via lead 318. Envelope detector 325 produces a signal representative of the envelope variations on the output of amplifier 310 which variations contain distortion originating in amplifier 310. The envelope signal from detector 325 is substracted from the output of envelope modulation generator 320 in operational amplifier 330 and the signal therefrom (waveform 415) is supplied to the input terminal of pulse width modulator 340 via loop compensator 335. A sequence of varying width pulses (waveform 420) corresponding to the output of operational amplifier 330 is generated in the pulse width modulator and coupled to amplifier 310 via filter 345. The output of filter 345 is shown in waveform 425. In this way, the distortion correction signal formed in operational amplifier 330 is applied to the class C amplifier to correct distortions due to its non-linear characteristics. The parameters of filter 345 are selected to remove the high frequency components of the pulse width modulator output and may result in unstable operation. Loop compensator 335 is a lead-lag type network having parameters which stabilize the feedback operation.

Figure 5:
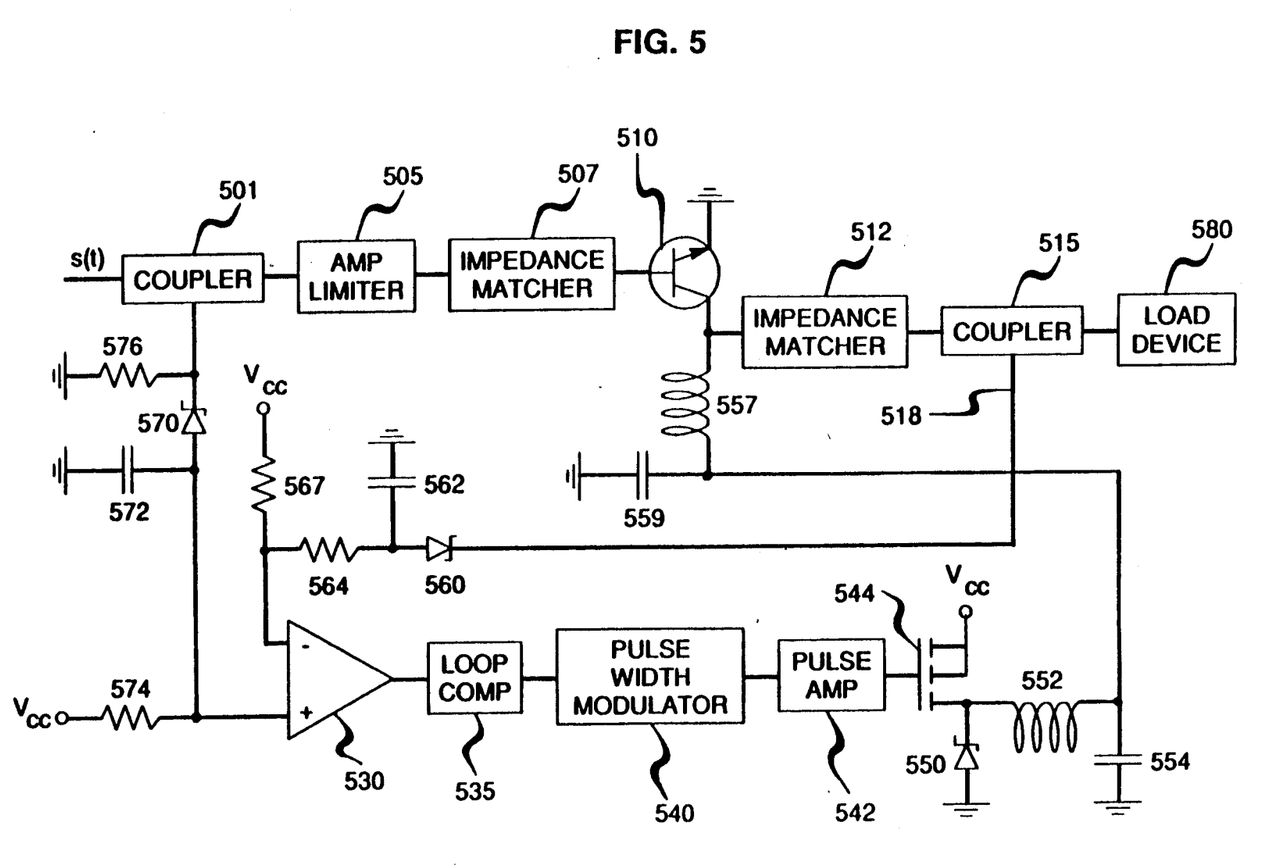
FIG. 5 is a more detailed diagram of the circuit of FIG. 1.

FIG. 5 is a more detailed diagram of the circuit of FIG. 1. In FIG. 5 class C amplifier 110 is shown as comprising input impedance matcher 507, transistor 510, output impedance matcher 512, and inductor 557 and capacitor 559. Envelope detector 120 is shown as comprising Shottky diode 570, biasing resistors 574 and 576, and capacitor 572. Envelope detector 125 is shown as including Shottky diode 560, bias resistors 564 and 567 and capacitor 562. Filter 145 is shown as including Shottky diode 550, inductor 552 and capacitor 554 and the pulse width modulator is shown as including modulator 540, pulse amplifier 542 and output field effect transistor 544. Pulse width modulator 540 may be the Signetics type NE/SE5562 switched mode power supply control circuit and operational amplifier 530 may be the Motorola type MC34071 integrated circuit. Device 544 may be a p-channel MOSFET and pulse amplifier 542 may be a level shifting type drive amplifier well known in the art.

The main output of coupler 515 is applied to load device 580. The coupler output on lead 518 is applied to diode 560 which is poled to pass the negative envelope portion to the negative input of operational amplifier 530. An output of coupler 501 is applied to diode 570 so that the negative portion of the envelope of signal s(t) is applied to the positive input of operational amplifier 530. The bias resistances for diodes 560 and 570 are adjusted whereby the operation of the diodes track to prevent any distortion of the envelope signals supplied to operational amplifier 530. Pulse modulator 540, pulse amplifier 542 and FET 544 form a switching power supply to convert the constant supply voltage $V_{cc}$ into a high efficiency varying supply voltage which is applied to the inductor 557 and capacitor 559 via supply inductor 552 and capacitor 554. Diode 550 and inductor 552 are arranged to provide a conductive path when p-channel MOSFET is shut off to insure a continuous flow of power to transistor 510. While the arrangements shown in FIG. 5 are particularly adapted to implement the block diagram of FIG. 1, the detector and filter circuitry of FIG. 5 may also be used in the circuit of FIG. 3.

The invention has been described with reference to illustrative embodiments thereof. It is apparent, however, to one skilled in the art that various modifications and changes may be made without departing from the spirit and scope of the invention.

We claim:

1. A circuit for amplifying an angle and envelope varying radio frequency signal comprising:

a class C operated amplifying device having a base, an emitter and a collector a supply voltage source;

a loading device;

means for applying a signal corresponding to the angle varying radio frequency signal to the base of the class C operated amplifying device;

means for coupling the collector to the loading device;

means responsive to the envelope variations of the radio frequency signal for modulating the signal on the collector of the class C operated amplifying device, the modulating means having an input terminal and a pair of output terminals, said output terminals being coupled between the supply voltage source and the collector of the class C amplifying device;

the modulating means comprising a pulse width modulator connected to the input terminal and filter means coupled between the pulse width modulator and the collector having predefined parameters for removing high frequency portions of the pulse width modulator output;

means responsive to the angle and envelope varying radio frequency signal for forming a first signal corresponding to the envelope variations of the radio frequency signal;

means responsive to the radio frequency signal coupled to the loading device for forming a second signal corresponding to the envelope variations of the radio frequency signal at the load device;

means responsive to the first and second signals for producing a third signal representative of the difference between the first and second signals; and means for applying the third signal to the modulating means input terminal including means for compensating for the parameters of the filter means to maintain stable operation, whereby distortion in the envelope variations at the loading device is reduced.

2. A circuit for amplifying an angle and envelope varying radio frequency signal comprising:

a class C operated amplifying device having a base, an emitter and a collector a supply voltage source;

a loading device;

means for applying a signal corresponding to the angle varying radio frequency signal to the base of the class C operated amplifying device;

means for coupling the collector to the loading device;

means responsive to the envelope variations of the radio frequency signal for modulating the signal on the collector of the class C operated amplifying device, the modulating means having an input terminal and a pair of output terminals, said output terminals being coupled between the supply voltage source and the collector of the amplifying device;

means, comprising a first diode and means for biasing the first diode, responsive to the angle and envelope varying radio frequency signal for forming a first signal corresponding to the envelope variations of the radio frequency signal;

means, comprising a second diode and means for biasing the second diode, responsive to the radio frequency signal coupled to the loading device for forming a second signal corresponding to the envelope variations of the radio frequency signal at the load device;

the means for biasing the first and second diodes being set to maintain the first and second diodes at substantially similar operating characteristics;

means responsive to the first and second signals for producing a third signal representative of the difference between the first and second signals; and means for applying the third signal to the modulating means input terminal whereby distortion in the envelope variations at the loading device is reduced.

3. A circuit for amplifying an M-ary differential phase shift keying modulated radio frequency signal with envelope variations between the predefined phase shifts of the M-ary differential phase shift keyed modulation comprising:

an amplifying device having first, second and control electrodes;

a supply voltage source;

a loading device;

means for applying a signal corresponding to the M-ary differential phase shift keyed varying radio frequency signal to the control electrode of the amplifying device;

means for coupling the first electrode to the loading device;

means responsive to the envelope variations between the predefined phase shifts of the M-ary differential phase shift keyed modulation of the radio frequency signal for modulating the signal on the first electrode of the amplifying device, the modulating means having an input terminal and a pair of output terminals, said output terminals being coupled between the supply voltage source and the first electrode of the amplifying device;

means responsive to the M-ary differential phase shift keying modulated radio frequency signal with envelope variations between the predefined phase shifts of the M-ary differential phase shift keyed modulation signal for forming a first signal corresponding to the envelope variations between the predefined phase shifts of the M-ary differential phase shift keyed modulation of the radio frequency signal;

means responsive to the radio frequency signal coupled to the loading device for forming a second signal corresponding to the envelope variations between the predefined phase shifts of the M-ary differential phase shift keyed modulation of the radio frequency signal at the load device;

means responsive to the first and second signals for producing a third signal representative of the difference between the first and second signals; and means for applying the third signal to the modulating means input terminal whereby distortion in the envelope variations between the predefined phase shifts of the M-ary differential phase shift keyed modulation at the loading device is reduced.

4. A circuit for amplifying a carrier angle shift keyed modulated radio frequency signal with envelope variations between the predefined shifts of the carrier angle shift keyed modulation comprising:

a class C power amplifying device having an input terminal, an output terminal and a supply terminal;

a loading device coupled to the output terminal of the class C amplifier;

means responsive to the envelope varying carrier angle shift keyed modulated radio frequency signal for extracting the envelope variations from the radio frequency signal to form a first signal representative of the envelope variations of the radio frequency signal;

means responsive to the envelope varying carrier angle shift keyed modulated radio frequency signal for forming a constant magnitude carrier angle shift keyed modulated radio frequency signal having a magnitude greater than required to maintain class C operation of the class C power amplifying device;

means for applying the constant magnitude carrier angle shift keyed modulated radio frequency signal to the class C power amplifying device input terminal;

modulating means comprising a pulse width modulator having an input and an output, said output being coupled to the supply terminal of the class C power amplifying device to provide a signal for envelope modulating the constant magnitude carrier angle shift keyed modulated radio frequency signal applied to the class C power amplifying device;

means responsive to the radio frequency signal at the class C power amplifying device output terminal for forming a second signal corresponding to the envelope variations of the carrier angle shift keyed modulated radio frequency signal at said output terminal;

means responsive to the first and second signals for producing a third signal representative of the difference between the first and second signals; and means for applying the third signal to the modulating means input whereby distortion in the carrier angle shift keyed modulated radio frequency signal at the class C power amplifying device output terminal is reduced.

5. A circuit for amplifying a carrier angle shift keyed modulated radio frequency signal with envelope variations between the predefined shifts of the carrier angle shift keyed modulation according to claim 4 wherein the angle modulated carrier signal is a phase shift keyed modulated radio frequency signal with envelope variations between the predefined phase shifts of the phase shift keyed modulation.

6. A circuit for amplifying a carrier angle shift keyed modulated radio frequency signal with envelope variations between the predefined shifts of the carrier angle shift keyed modulation according to claim 4 wherein the angle modulated carrier signal is a differential phase shift keyed modulated radio frequency signal with envelope variations between the predefined shifts of the differential phase shift keyed modulation.

* * * * *